(12) United States Patent
Goto et al.

(10) Patent No.: US 9,099,367 B2
(45) Date of Patent: Aug. 4, 2015

(54) IMAGE SENSOR AND IMAGE PROCESSING DEVICE INCLUDING THE SAME

(75) Inventors: Hirosige Goto, Suwon-Si (KR); Yi Tae Kim, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 191 days.

(21) Appl. No.: 13/541,996

(22) Filed: Jul. 5, 2012

(65) Prior Publication Data

US 2013/0012263 A1 Jan. 10, 2013

(30) Foreign Application Priority Data

Jul. 8, 2011 (KR) .................. 10-2011-0068001

(51) Int. Cl.
| | |
|---|---|
| *H01L 27/146* | (2006.01) |
| *H04N 5/3745* | (2011.01) |
| *H04N 5/376* | (2011.01) |
| *H04N 5/355* | (2011.01) |
| *H04N 5/365* | (2011.01) |
| *H04N 17/00* | (2006.01) |

(52) U.S. Cl.
CPC ...... *H01L 27/1461* (2013.01); *H01L 27/14616* (2013.01); *H04N 5/355* (2013.01); *H04N 5/365* (2013.01); *H04N 5/376* (2013.01); *H04N 5/3745* (2013.01); *H04N 17/002* (2013.01)

(58) Field of Classification Search
None
See application file for complete search history.

(56) References Cited

U.S. PATENT DOCUMENTS

| 5,517,242 | A * | 5/1996 | Yamada et al. ............... 348/254 |
| 6,366,312 | B1 * | 4/2002 | Crittenden .................... 348/187 |
| 6,797,933 | B1 * | 9/2004 | Mendis et al. ................ 348/308 |
| 2004/0065808 | A1 * | 4/2004 | Kochi et al. ................. 250/214.1 |
| 2005/0264684 | A1 * | 12/2005 | Kamon et al. ................ 348/362 |
| 2010/0060762 | A1 * | 3/2010 | Takada et al. ................. 348/300 |
| 2011/0013040 | A1 * | 1/2011 | Han et al. ................... 348/222.1 |

FOREIGN PATENT DOCUMENTS

| JP | 2003189315 | 7/2003 |
| JP | 2004048563 | 2/2004 |
| JP | 2004201094 | 7/2004 |
| KR | 20060024796 A | 3/2006 |

* cited by examiner

*Primary Examiner* — Jason Flohre
(74) *Attorney, Agent, or Firm* — Volentine & Whitt, PLLC (57) ABSTRACT

An image sensor includes a pixel array and a calibration circuit. The pixel array includes a plurality of pixels each of which includes a photoelectric conversion device configured to absorb incident light and generate a photocharge, a transfer transistor configured to transfer the photocharge from the photoelectric conversion device to a floating diffusion node, and a reset transistor configured to reset the floating diffusion node. The calibration circuit is connected to the reset transistor of each pixel, and is configured to apply a different voltage to each pixel and adjust an amount of photocharge generated by the photoelectric conversion device in each pixel.

18 Claims, 8 Drawing Sheets

IMAGE SENSOR AND IMAGE PROCESSING DEVICE INCLUDING THE SAME

CROSS-REFERENCE TO RELATED APPLICATIONS

A claim of priority under 35 U.S.C. §119(a) is made to Korean Patent Application No. 10-2011-0068001 filed on Jul. 8, 2011, the disclosure of which is hereby incorporated by reference in its entirety.

BACKGROUND

The inventive concept relates to an image sensor and an image processing device including the same, and more particularly, to an image sensor which utilizes a calibration circuit to overcome a non-linearity condition, and to an image processing device including the same.

An image sensor senses light and converts the intensity of the light into digital image data. With the development of complementary metal oxide semiconductor (CMOS) technology, a CMOS image sensor (CIS) using CMOS technology is widely being used.

The CIS uses a dynamic range function and a wide dynamic range (WDR) function to provide a sharp image in an environment exhibiting a high luminance differential. The WDR function is realized using a well capacity adjusting method or a multiple sampling method in which a plurality of images of a scene taken at greatly different exposure times are combined to create a single image of the scene. The multiple sampling method has a favorable combination quality, but it requires a frame memory or a plurality of line memories since a plurality of images need to be combined with one another with time differences. The well capacity adjusting method also suffers drawbacks related to mixing images due to a large distribution of pixels and exhibits a non-linearity problem.

A dynamic range is defined as the range of response to the relative quantity of light that can be represented by a system. The lower limit of the dynamic range is restricted by the minimum quantity of light that can be represented or sensed by the system, and the upper limit thereof is a maximum quantity of light that can be sensed by the system. At the quality of light over the upper limit, a signal is saturated.

SUMMARY

According to some embodiments of the inventive concept, there is provided an image sensor which includes a pixel array and a calibration circuit. The pixel array includes a plurality of pixels each of which comprises a photoelectric conversion device configured to absorb incident light and generate a photocharge, a transfer transistor configured to transfer the photocharge from the photoelectric conversion device to a floating diffusion node, and a reset transistor configured to reset the floating diffusion node. The calibration circuit is connected to the reset transistor of each pixel, and is configured to apply a different voltage to each pixel and adjust an amount of photocharge generated by the photoelectric conversion device in each pixel.

The calibration circuit may create a function based on a signal output from each of the pixels according to an adjusted amount of photocharge. When the signal is non-linear, the calibration circuit may calibrate the non-linear signal into a linear signal based on the function.

The image sensor may further include a converter configured to convert the calibrated linear signal from an analog form to a digital form.

The calibration circuit may include a plurality of resistors. At least one of the resistors may be connected between the reset transistor of a first pixel and the reset transistor of a second pixel. At least one of the resistors may be connected between the reset transistor of the second pixel and the reset transistor of a third pixel. The at least one resistor connected between the reset transistor of the first pixel and the reset transistor of the second pixel may be connected to a drain of each of the reset transistors comprised in the respective first and second pixels, and the at least one resistor connected between the reset transistor of the second pixel and the reset transistor of the third pixel may be connected to a drain of each of the reset transistors comprised in the respective second and third pixels.

The calibration circuit may read out the signal output from each of the pixels.

According to other embodiments of the inventive concept, there is provided an image processing device including the above-described image sensor and a processor configured to control an operation of the images sensor. The image processing device may be a cellular phone, a tablet personal computer, or a digital single-lens reflex camera.

According to still other embodiments of the inventive concept, there is provided an image pixel array includes a plurality of pixel elements each including a photoelectric conversion element, a floating diffusion region, a transfer transistor connected between the photoelectric conversion element and the floating diffusion region, and a reset transistor connected between the floating diffusion region and a reset node. The image pixel array further includes a series connection of resistive elements, wherein each respective resistive element is connected between the reset nodes of adjacent pixel elements.

BRIEF DESCRIPTION OF THE DRAWINGS

The above and other features and advantages of the inventive concept will become more apparent by describing in detail exemplary embodiments thereof with reference to the attached drawings in which.

DETAILED DESCRIPTION OF THE EMBODIMENTS

The inventive concept now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1A:
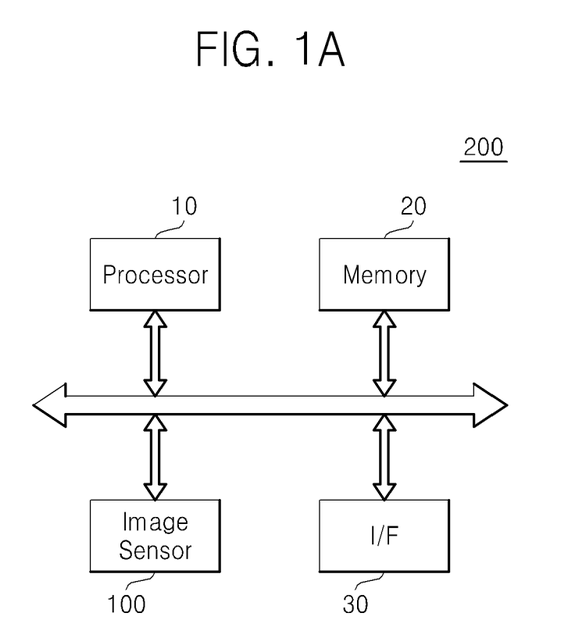
FIGS. 1A and 1B are block diagram of an image processing device including an image sensor according to some embodiments of the inventive concept.
Figure 1B:
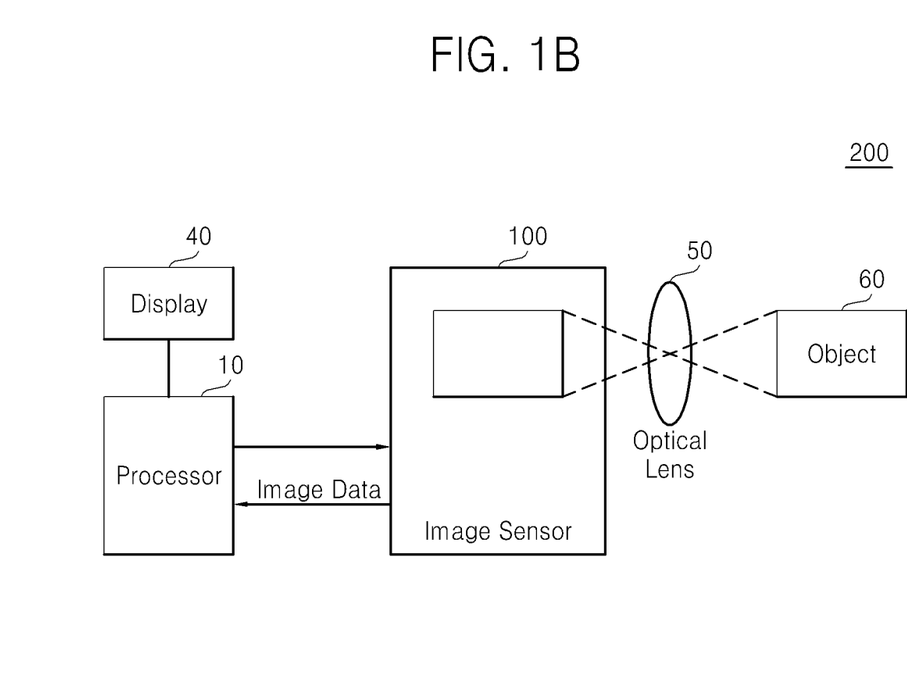

FIGS. 1A and 1B are block diagrams of an image processing device 200 including an image sensor 100 according to some embodiments of the inventive concept. The image processing device 200 may be implemented as a digital camera or a data processing device, such as a personal computer (PC), a cellular phone, a smart phone, a tablet PC or an information technology (IT) device, including the digital camera. The digital camera may be a digital single-lens reflex (DSLR) camera.

The image processing device 200 may include the image sensor 100, a processor 10, a memory device 20, an interface 30 and an optical lens 50. The image processing device 200 may process two- or three-dimensional image information. The processor 10 controls the operation of the image sensor 100. The interface 30 may be an image display device like a display 40.

The image processing device 200 is a device that processes an output image of the image sensor 100. The image processing device 200 may be a computer device, a camera device, a scanner, a mechanized clock device, a mechanical clock device, a navigation device, a video phone, a monitoring device, an auto focusing device, a tracking device, a motion detecting device, or an image stabilizing device, but it is not limited to those examples. The image processing device 200 such as a computer device may include a central processing unit (CPU) such as the micro processor 10 that can communicate with an input/output (I/O) unit through a bus.

The memory device 20 included in the image processing device 200 may store still or moving images captured by the image sensor 100. The memory device 20 may be implemented by a non-volatile memory device. The non-volatile memory device may include a plurality of non-volatile memory cells.

The image sensor 100 converts an optical image signal of an object 60 received through the optical lens 50 into electrical image data. The processor 10 controls the operation of the image sensor 100, processes the image data output from the image sensor 100 and transmits the processed image data to the display 40 so that the image data is displayed.

The image sensor 100 may communicate with other devices through a bus or other communication links. The image processing device 200 may also include a memory device, a storage unit and a port that are able to communicate with the CPU through the bus.

The port may be coupled with a video card, a sound card, a memory card or a universal serial bus (USB) device or may communicate data with other devices.

The image sensor 100 may be integrated with a digital signal processor (DSP) or the processor 10 in other embodiments of the inventive concept. Referring to FIGS. 1A and 1B, the image sensor 100 may be integrated with the memory device 20 and may be implemented in a chip separated from the processor 10.

Figure 2:
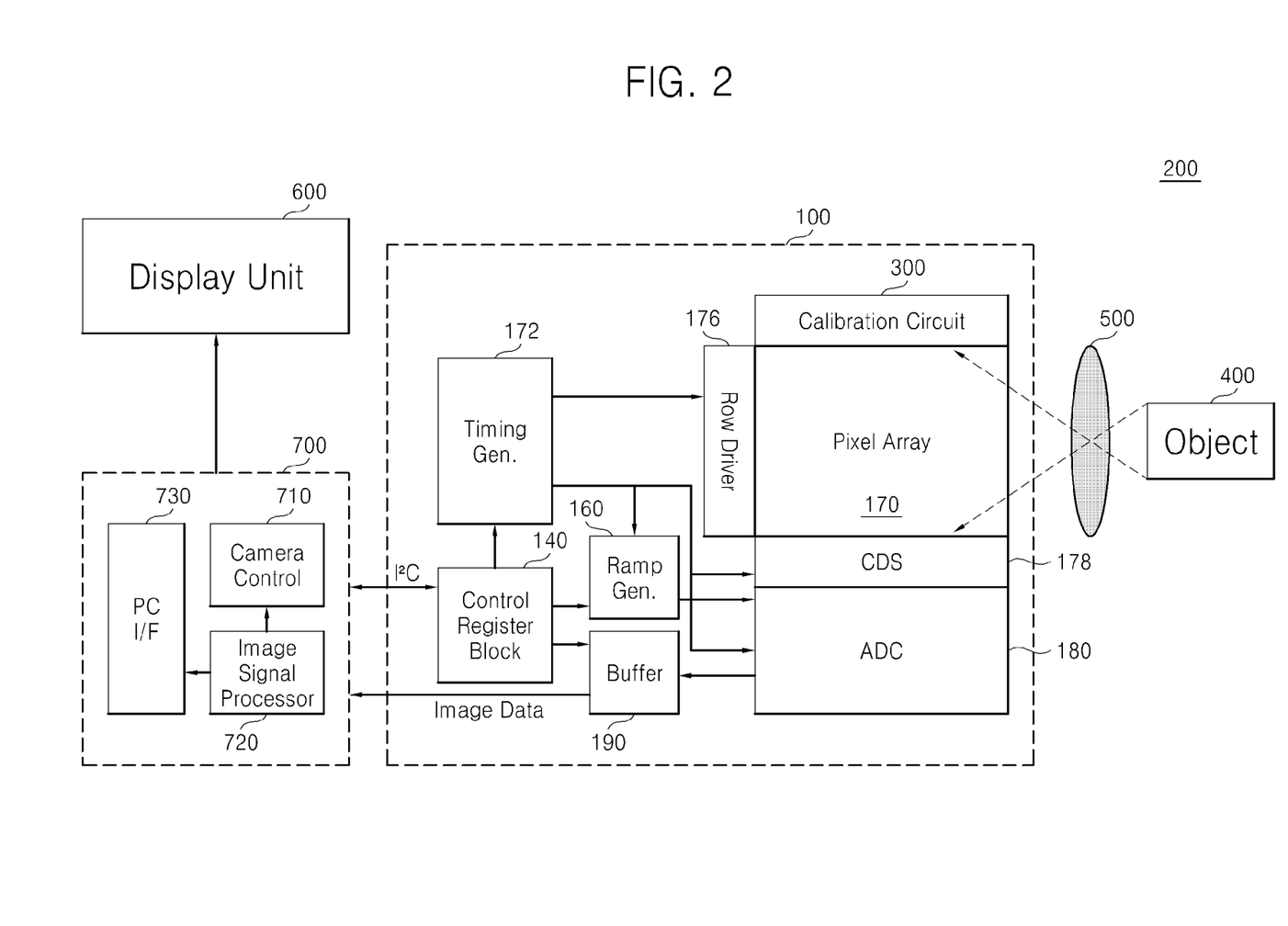
FIG. 2 is a block diagram of the image processing device illustrated in FIGS. 1A and 1B.

FIG. 2 is a block diagram showing, in additional detail, an example of the image processing device illustrated in FIGS. 1A and 1B. Referring to FIG. 2, the image processing apparatus 200 of this example includes an image sensor 100 and an image processor 700. The image sensor 100 and the image processor 700 may be implemented in separate chips or modules, respectively.

The image sensor 100 generates an image signal (image data) corresponding to an object 400 based on incident light. The image sensor 100 of this example includes a pixel array 170, a row decoder/driver 176, a correlated double sampling (CDS) block 178, an analog-to-digital converter (ADC) 180, a ramp generator 160, a timing generator 172, a control register block 140, a buffer 190 and a calibration circuit 300.

The image sensor 100 may be controlled by the image processor 700 to sense the object 400 captured through a lens 500 and output an image of the object 400. The image processor 700 may transmit the image to a display unit 600. At this time, the display unit 600 may be any device that can output the image. For instance, the display unit 600 may be a computer, a portable phone, or any type of image display terminal.

The image processor 700 includes a camera control 710, an image signal processor 720, and a personal computer (PC) interface (I/F) 730.

The camera control 710 generally controls the image sensor 100. In the example of this embodiment the camera control 710 controls the image sensor 100, and more specifically, the control register block 140 using an inter-integrated circuit ($I^2C$), but the scope of the inventive concept is not restricted thereto.

The image signal processor 720 receives image data, i.e., an output signal of the buffer 190, processes the image data into a suitable visual image for display on a display unit 600 using the PC I/F 730.

Although the image signal processor 720 is provided within the image processor 700 in the embodiment illustrated in FIG. 2, the inventive concept is not limited to the example of FIG. 2. For instance, the image signal processor 720 may instead be positioned within the image sensor 100.

The pixel array 170 includes a plurality of photoelectric conversion devices such as photo diodes or pinned photo diodes. The pixel array 170 receives incident light using the photoelectric conversion devices and converts the incident light into an electrical signal to generate an image signal.

There is a trade-off between the saturation level of a photoelectric conversion device and a white spot phenomenon and dark current. In other words, when the saturation level is improved, the white spot phenomenon and the dark current may be worsened. In order to improve the white spot phenomenon and the dark current as well as the saturation level, it may be desirable to utilize a photoelectric conversion device having characteristics specially adapted to a operating environment.

In the example of this embodiment, the timing generator 172 outputs a control signal to the row driver 176, the ADC 180, and the ramp generator 160 to control the operations of the row driver 176, the ADC 180, and the ramp generator 160. Also in the example of this embodiment, the control register block 140 outputs a control signal to the ramp generator 160, the timing generator 172, and the buffer 190 to control the operations of the elements 160, 172, and 190, and the control register block 140 is controlled by the camera control 710 as mentioned above.

The row driver 176 of this example drives the pixel array 170 in units of rows. For instance, the row driver 176 may generate a row select signal. In this case, pixel array 170 outputs to the CDS block 178 a reset signal and an image signal from a row selected by the row select signal received from the row driver 176. The CDS block 178 may perform CDS on the reset signal and the image signal.

The ADC 180 of the example of this embodiment compares a ramp signal output from the ramp generator 160 with a CDS signal output from the CDS block 178, generates a comparison result signal, counts the comparison result signal, and outputs a count result to the buffer 190.

The buffer 190 of the example of this embodiment temporarily stores a digital signal output from the ADC 180 and senses and amplifies the digital signal before outputting the same. The buffer 190 may include a plurality of column memory blocks, e.g., static random access memories (SRAMs), provided for respective columns for temporal storing, and a sense amplifier sensing and amplifying the digital signal received from the ADC 180.

The calibration circuit 300 of the example of this embodiment adjusts the magnitude of an externally applied voltage such that photoelectric conversion devices of a plurality of pixels included in the pixel array 170 are filled with different amounts of charge. As will be discussed in greater detail later, the calibration circuit 300 of one or more embodiments adjusts an amount of photocharge generated at a photoelectric conversion device by applying a different voltage to each pixel, and may also create a function or a reference table based on a signal output from each pixel according to the adjusted amount of photocharge. Although the calibration circuit 300 is shown as being separate from the pixel array 170, it can also be considered as forming a part of the pixel array 170.

Figure 3A:
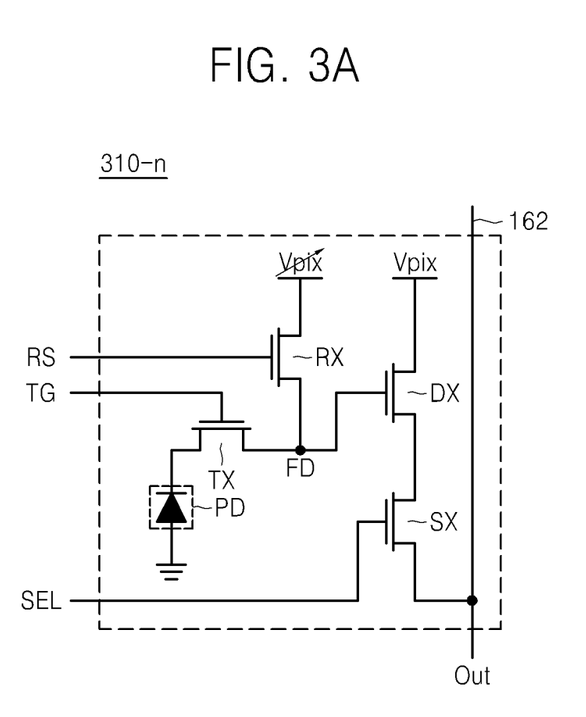
FIGS. 3A through 3C are circuit diagrams of a pixel included in an image sensor.
Figure 3B:
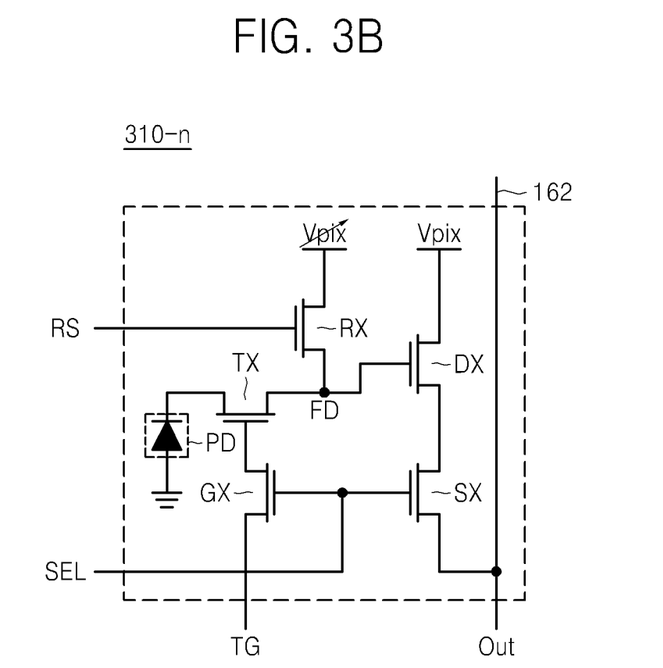
Figure 3C:
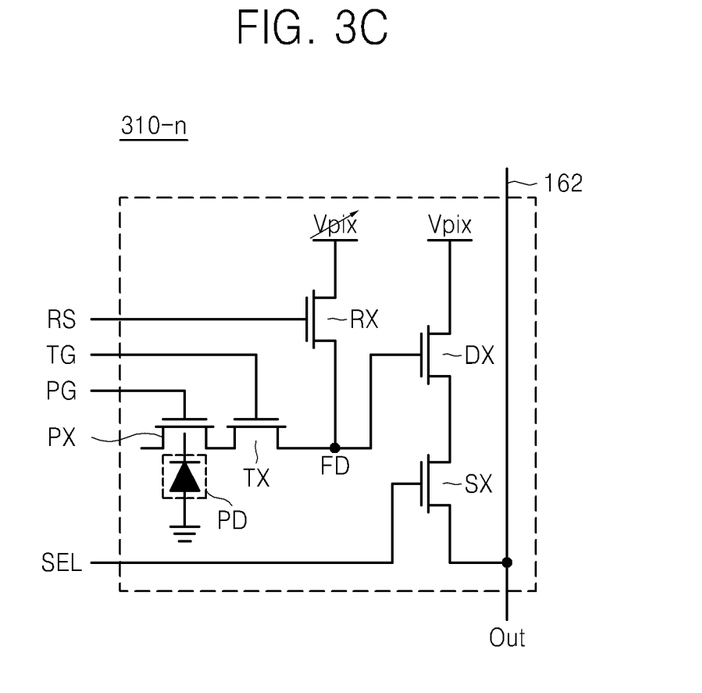

FIGS. 3A through 3C are circuit diagrams illustrating examples of a unit pixel included in an image sensor.

Referring to FIG. 3A, the unit pixel of this example includes a photoelectric conversion device PD, a transfer transistor TX, a floating diffusion node FD, a reset transistor RX, a drive transistor (or a source follow transistor) DX, and a select transistor SX.

The photoelectric conversion device PD receives (or absorbs) incident light energy emitted from a light emitting source, and is response to the incident light energy to generate photocharges (i.e., photo induced electric charges) which are accumulated at the photoelectric conversion device PD. The transfer transistor TX transmits the photocharge (or photocurrent) accumulated at the photoelectric conversion device PD to the floating diffusion node FD in response to a transfer control signal TG.

The floating diffusion node FD is formed by a floating diffusion region and receives and stores the photocharge from the photoelectric conversion device PD through the transfer transistor TX.

The reset transistor RX is connected between a power supply voltage VDD and the floating diffusion node FD, and resets the floating diffusion node FD to the power supply voltage VDD in response to a reset signal RS.

The drive transistor DX is connected between the power supply voltage VDD and a first node, and causes the first node to source-follow the power supply voltage VDD based on the charge at the floating diffusion node FD.

The select transistor SX is connected to the first node and an output node, and forms an electrical path between the first node and the output node in response to a select signal SEL.

Referring back to FIG. 2, each of a plurality of pixels in a column may output pixel signals (e.g., a reset signal and an image signal) in response to a plurality of control signals (e.g., TG, RS and SEL illustrated in FIG. 3A) generated by the row driver 176.

A signal Vout output from the pixel may be converted to digital image signal values by the ADC 180.

FIG. 3A shows a pixel including a single photoelectric conversion device PD and four MOS transistors TX, RX, DX and SX, but the inventive concept is not restricted to this example. Other circuits including the photoelectric conversion device PD and at least three transistors including the drive transistor DX and the select transistor SX may be used in the embodiments of the inventive concept. Other examples of a pixel are shown in FIGS. 3B through 3C.

Referring to FIG. 3B, an example of a 5T pixel is shown, which includes a photoelectric conversion device PD, a reset transistor RX, a drive transistor (or a source follow transistor) DX, a select transistor SX, and two more transistors GX and TX.

Referring to FIG. 3C, another example of a 5T pixel is shown, which includes a photoelectric conversion device PD, a reset transistor RX, a drive transistor (or a source follow transistor) DX, a select transistor SX, and two more transistors PX and TX.

Generally speaking, in each pixel configuration, the pixel is configured such that the reset transistor RX is connected between the variable power supply voltage Vpix and the floating diffusion node FD, and resets the floating diffusion node FD to the variable power supply voltage Vpix in response to the reset signal RS.

In addition, the drive transistor DX is connected between the power supply voltage Vpix and the floating diffusion node FD. A voltage changing according to the charge stored at the floating diffusion node FD is output to the vertical signal line. A source of the drive transistor DX is connected to a drain of the select transistor SX and a drain of the drive transistor DX is connected to the power supply voltage Vpix.

Figure 4:
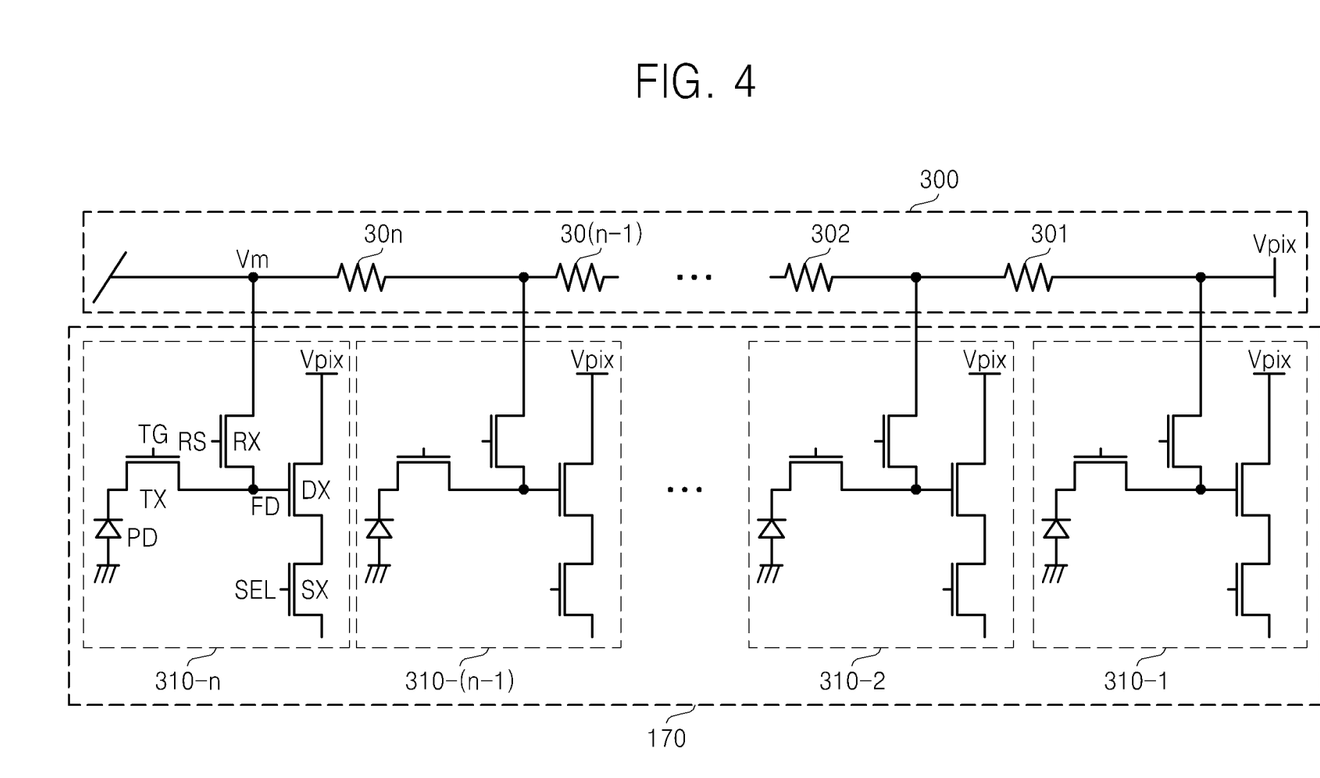
FIG. 4 is a circuit diagram of a pixel array included in an image sensor according to some embodiments of the inventive concept.

FIG. 4 is a circuit diagram of an example of the pixel array 170 included in the image sensor 100 according to some embodiments of the inventive concept. Referring to FIGS. 2 and 4, the pixel array 170 of the image sensor 100 includes a plurality of pixels 310-1, 310-2, 310-3, . . . , 310-n (where "n"

is a natural number), each of which may be configured as shown in FIGS. 3A, 3B, 3C or 3D, and each of which is connected with the calibration circuit 300.

The calibration circuit 300 is connected with the reset transistor RX of each of the pixels 310-1 through 310-n. When a medium voltage Vm is applied to the transfer transistor TX of each pixel, the calibration circuit 300 may create a function based on an output signal of each pixel.

When the output signal of the pixel array 170 is non-linear, the calibration circuit 300 may calibrate the output signal so that the output signal becomes proportional to the intensity of light, that is, the output signal becomes linear. The calibrated linear output signal may be converted from an analog form into a digital form by the ADC 180.

The calibration circuit 300 may include a plurality of resistors 301, 302, . . . , 30(n-1), and 30n where "n" is a natural number, which may be connected in series as shown. The voltage Vpix is divided through the resistors 301 through 30n so that a different voltage is applied to a reset node of the reset transistor RX of each pixel.

The reset transistor RX is turned off in response to the reset signal RS, thus floating the floating diffusion node FD. In response to the transfer gate signal TG, the transfer transistor TX transmits charges integrated by the photoelectric conversion device PD for a first exposure integration time to the floating diffusion node FD.

Thereafter, the transfer transistor TX is turned off, separating the photoelectric conversion device PD from the floating diffusion node FD. At this time, the charges integrated for the first exposure integration time are stored at the floating diffusion node FD and the photoelectric conversion device PD is, for example, half empty. The photoelectric conversion device PD in the half-empty state accumulates charges again for a second exposure integration time while the transfer transistor TX is turned off.

In response to the select signal SEL, the select transistor SX is turned on, connecting an output terminal of the drive transistor DX to an output signal line 162 illustrated, for example, in FIGS. 3A through 3D. A voltage of the floating diffusion node FD is amplified by the drive transistor DX and an amplified voltage Vout(a) is output to the output signal line 162. An amplified voltage Vout(a) is output before the floating diffusion node FD is reset by the reset transistor RX.

Thereafter, the reset signal RS transits to a logic high, and therefore, the reset transistor RX resets the floating diffusion node FD. A voltage Vout(b) is output to the output signal line 162 through the drive transistor DX, the voltage Vout(b) is output when the floating diffusion node FD has been reset.

While the voltages Vout(a) and Vout(b) are output through such double sampling, the select signal SEL is maintained at a logic high. The ADC 180 may finally convert a difference between the voltages Vout(a) and Vout(b), i.e., Vout=[Vout(a)−Vout(b)], resulting from the double sampling into a digital code value.

In detail, voltages applied to the reset transistors RX of the respective first through third pixels 310-1, 310-2 and 310-3 may be different from one another. At least one resistor may be connected between the reset transistor RX of the first pixel 310-1 and the reset transistor RX of the second pixel 310-2 and at least one resistor may be connected between the reset transistor RX of the second pixel 310-2 and the reset transistor RX of the third pixel 310-3. At this time, each resistor is connected to a drain of adjacent pairs of reset transistors RX.

When a different voltage is applied to the reset transistor RX, the number of charges accumulated at the photoelectric conversion device PD may be changed. When the resistors 301 through 30n have the same resistance value, the voltage Vpix is applied to the first pixel 310-1 and a difference between a voltage applied to the first pixel 310-1 and a voltage applied to the second pixel 310-2 is the same as a difference between the voltage applied to the second pixel 310-2 and a voltage applied to the third pixel 310-3. However, the inventive concept is not restricted thereto.

When a different voltage is applied to the reset transistor RX of each pixel through the calibration circuit 300, the amount of photocharge generated at the photoelectric conversion device PD can be adjusted as if an integration time is adjusted.

The calibration circuit 300 may be included within the pixel array 170 and may show the same output signal characteristic as the pixel array 170. Accordingly, the signal output from the pixel array 170 can be read out by the calibration circuit 300.

While adjustment is carried out such that a different amount of photocharge is accumulated at each of the pixels 310-1 through 310-n, the linearity of an output signal may be determined using the calibration circuit 300. When each of a plurality of photoelectric conversion devices PD is filled with a certain amount of photocharge, the calibration circuit 300 may detect information about whether the output signal exhibits non-linearity. The calibration circuit 300 may calibrate a non-linear output signal into a linear output signal.

For instance, if a voltage applied to the transfer transistor TX is a medium voltage Vm between a maximum voltage that allows all photocharge at the photoelectric conversion device PD to be transferred to the floating diffusion node FD and a minimum voltage that does not allow any of photocharge at the photoelectric conversion device PD to be transferred to the floating diffusion node FD, the transfer transistor TX may transfer half of the photocharge at the photoelectric conversion device PD to the floating diffusion node FD.

However, when a voltage around the medium voltage Vm is applied to the transfer transistor TX, an output signal may become non-linear. Accordingly, the calibration circuit 300 detects a period while a non-linear signal is output and creates a function. In other words, when the amount of an output signal of a pixel is less or greater than the amount of a signal that the pixel is supposed to output, the calibration circuit 300 creates a function for correcting it.

An image sensor is thus obtained with a relatively long integration time T1 and a relatively short integration time Ts, and which does not require numerous memory devices since it does not separately carry out an exposure with the long integration time T1 and an exposure with short integration time Ts.

This image sensor can be embodied by exposing the photoelectric conversion device PD to light with the long integration time T1 and applying the medium voltage to the transfer transistor TX to newly fill the photoelectric conversion device PD with charges. However, when the medium voltage is applied to realize the short integration time Ts, an output signal may have non-linearity at around the medium voltage. The calibration circuit 300 is used to adjust the amount of charges accumulated at the photoelectric conversion device PD and detect at what amount of charges the output signal shows non-linearity. The calibration circuit 300 creates a function based on the amount of charges and corrects the non-linearity of the output signal using the function.

The calibration circuit 300 illustrated in FIG. 4 is intended as an example and the inventive concept is not restricted to the drawings. For instance, other circuits that can allow a different amount of charge to be accumulated at each of a plurality of photoelectric conversion devices PD can be used in the inventive concept, even circuits which do not include the resistors of FIG. 4.

Figure 5:
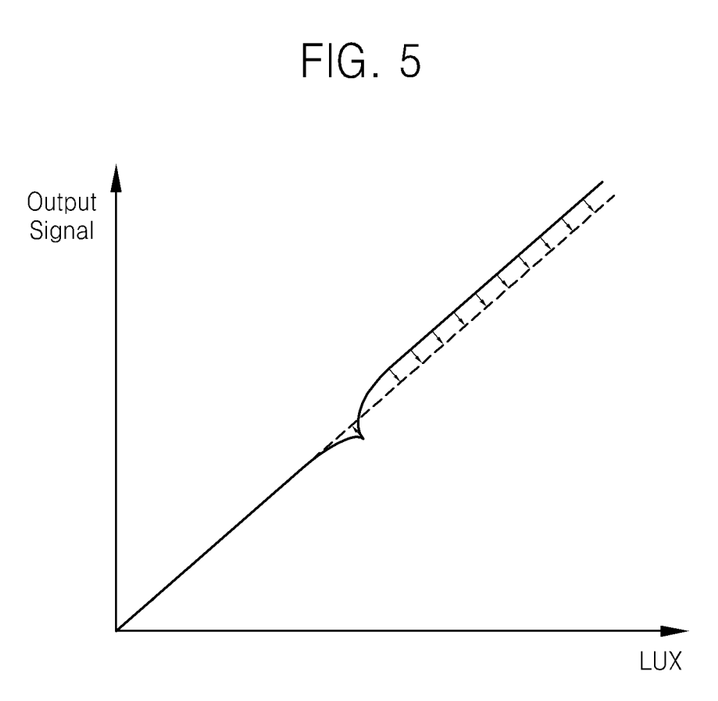
FIG. 5 is a graph showing the change in an output signal of an image sensor in some embodiments of the inventive concept.

FIG. 5 is a graph showing an example of a change in an output signal of an image sensor in some embodiments of the inventive concept. In the graph shown in FIG. 5, the x-axis indicates the intensity of light, i.e., lux and the y-axis indicates the magnitude of an output signal. When the calibration circuit 300 is not used, a non-linear output signal occurs. Information indicative of what amount of charge the output signal shows non-linearity can be obtained using the calibration circuit 300. The calibration circuit 300 creates a function for correcting the non-linearity and enables a signal calculated using the function to be output, so that a linear signal is output. Referring to FIG. 5, the output signal is calibrated in arrowed directions.

As described above, according to some embodiments of the inventive concept, a calibration circuit calibrates a voltage applied to each pixel in an image sensor, detects a signal level at which non-linearity occurs, and corrects the non-linearity, so that the image sensor outputs a linear signal.

Since the output signal is linear, a dynamic range is widened, and therefore, a stable wide dynamic range (WDR) can be realized.

While the inventive concept has been particularly shown and described with reference to exemplary embodiments thereof, it will be understood by those of ordinary skill in the art that various changes in forms and details may be made therein without departing from the spirit and scope of the inventive concept as defined by the following claims.

What is claimed is:

1. An image sensor comprising:
a pixel array comprising a plurality of pixels each of which comprises a photoelectric conversion device configured to absorb incident light and generate a photocharge, a transfer transistor configured to transfer the photocharge from the photoelectric conversion device to a floating diffusion node, and a reset transistor configured to reset the floating diffusion node; and
a calibration circuit connected to the reset transistor of each pixel, and configured to apply respective adjustable voltages to the reset transistor of each pixel to adjust an amount of photocharge generated by the photoelectric conversion device in each pixel,
wherein when a signal output from the pixels is non-linear, the calibration circuit is configured to calibrate the non-linear signal into a linear signal by adjusting the magnitude of the respective adjustable voltages.

2. The image sensor of claim 1, wherein the calibration circuit creates a function based on a signal output from each of the pixels according to an adjusted amount of photocharge to determine the magnitude of the respective adjustable voltages.

3. The image sensor of claim 1, further comprising a converter configured to convert the calibrated linear signal from an analog form to a digital form.

4. The image sensor of claim 1, wherein the calibration circuit comprises a plurality of resistors,
at least one of the resistors is connected between the reset transistor of a first pixel and the reset transistor of a second pixel, and
at least one other of the resistors is connected between the reset transistor of the second pixel and the reset transistor of a third pixel.

5. The image sensor of claim 4, wherein the at least one resistor connected between the reset transistor of the first pixel and the reset transistor of the second pixel is connected to a drain of each of the reset transistors comprised in the respective first and second pixels, and the at least one other resistor connected between the reset transistor of the second pixel and the reset transistor of the third pixel is connected to a drain of each of the reset transistors comprised in the respective second and third pixels.

6. The image sensor of claim 1, wherein the calibration circuit reads out a signal output from each of the pixels.

7. The image sensor of claim 1, wherein the calibration circuit is positioned within the pixel array.

8. The image sensor of claim 1, wherein the calibration circuit creates a reference table based on a signal output from each of the pixels according to an adjusted amount of photocharge to determine the magnitude of the respective adjustable voltages.

9. The image sensor of claim 8, further comprising a converter configured to convert the calibrated linear signal from an analog form to a digital form.

10. An image processing device comprising:
an image sensor; and
a processor configured to control an operation of the image sensor,
wherein the image sensor comprises,
a pixel array comprising a plurality of pixels each of which comprises a photoelectric conversion device configured to absorb incident light and generate a photocharge, a transfer transistor configured to transfer the photocharge from the photoelectric conversion device to a floating diffusion node, and a reset transistor configured to reset the floating diffusion node; and
a calibration circuit connected to the reset transistor of each pixel, and configured to apply respective adjustable voltages to the reset transistor of each pixel to adjust an amount of photocharge generated by the photoelectric conversion device in each pixel,
wherein when a signal output from the pixels is non-linear, the calibration circuit is configured to calibrate the non-linear signal into a linear signal by adjusting the magnitude of the respective adjustable voltages.

11. The image processing device of claim 10, wherein the image processing device is a cellular phone.

12. The image processing device of claim 10, wherein the image processing device is a tablet personal computer.

13. The image processing device of claim 10, wherein the image processing device is a digital single-lens reflex camera.

14. An image pixel array comprising:
a plurality of pixel elements each comprising a photoelectric conversion element, a floating diffusion region, a transfer transistor connected between the photoelectric conversion element and the floating diffusion region, and a reset transistor connected between the floating diffusion region and a reset node, the reset transistor configured to reset the floating diffusion region; and
a series connection of resistive elements, wherein each respective resistive element is connected between the reset nodes of adjacent pixel elements,
wherein the resistive elements are configured to provide respective adjustable voltages to the reset transistor of each of the pixel elements to calibrate a non-linear signal output from the pixel elements into a linear signal.

15. The image pixel array of claim 14, wherein a resistance of each of the resistive elements is the same.

16. The image pixel array of claim 14, wherein each pixel element further comprises a drive transistor connected between a pixel supply voltage and an output line, wherein the drive transistor is gated to the floating diffusion region.

17. The image pixel array of claim 16, wherein an end of the series connection of resistive elements is connected to the pixel supply voltage.

18. The image pixel array of claim 17, further comprising a select transistor connected in series with the drive transistor between the pixel supply voltage and the output line.

* * * * *